(12) United States Patent
Vettori

(10) Patent No.: US 11,307,221 B2
(45) Date of Patent: Apr. 19, 2022

(54) CANTILEVER CONTACT PROBE AND CORRESPONDING PROBE HEAD

(71) Applicant: Technoprobe S.p.A., Cernusco Lombardone (IT)

(72) Inventor: Riccardo Vettori, Cernusco Lombardone (IT)

(73) Assignee: Technoprobe S.p.A., Cernusco Lombardone (IT)

( * ) Notice: Subject to any disclaimer, the term of this patent is extended or adjusted under 35 U.S.C. 154(b) by 0 days.

(21) Appl. No.: 16/931,188

(22) Filed: Jul. 16, 2020

(65) Prior Publication Data

US 2020/0348337 A1 Nov. 5, 2020

Related U.S. Application Data

(63) Continuation-in-part of application No. PCT/EP2019/051024, filed on Jan. 16, 2019.

(30) Foreign Application Priority Data

Jan. 17, 2018 (IT) .................. 102018000001173

(51) Int. Cl.
*G01R 1/067* (2006.01)
*G01R 1/073* (2006.01)

(52) U.S. Cl.
CPC ..... *G01R 1/06727* (2013.01); *G01R 1/07378* (2013.01)

(58) Field of Classification Search
CPC .................. G01R 1/06727; G01R 1/07378
See application file for complete search history.

(56) References Cited

U.S. PATENT DOCUMENTS

| | | | |
|---|---|---|---|
| 2005/0083072 A1* | 4/2005 | Mori ................. | G01R 1/06727 324/756.03 |
| 2010/0134126 A1* | 6/2010 | Hong ................. | H01R 12/526 324/754.03 |
| 2010/0219854 A1 | 9/2010 | Kuniyoshi et al. | |
| 2011/0043232 A1 | 2/2011 | Takase et al. | |
| 2013/0342232 A1 | 12/2013 | Park | |
| 2020/0348336 A1* | 11/2020 | Vettori ............... | G01R 1/07342 |

FOREIGN PATENT DOCUMENTS

JP 2002-365308 A 12/2002

* cited by examiner

*Primary Examiner* — Paresh Patel
(74) *Attorney, Agent, or Firm* — Seed Intellectual Property Law Group LLP

(57) ABSTRACT

A cantilever contact probe includes a shaped probe body included between a descending probe section and an ascending probe section. At least one end portion is formed in the descending probe section, and bent with respect to a longitudinal axis starting from a bending point and ending with a contact tip of the cantilever contact probe that is configured to abut onto a contact pad of a device under test of that wafer. Suitably, the shaped probe body comprises at least one base portion, an upper portion extending, starting from the base portion, along a longitudinal extension axis of the shaped probe body, orthogonally to the reference plane and a top portion, connected to the upper portion and having a greater diameter than a diameter of the upper portion to form a T, the upper portion being the stem of the T and the top portion being the crosspiece of the T.

22 Claims, 13 Drawing Sheets

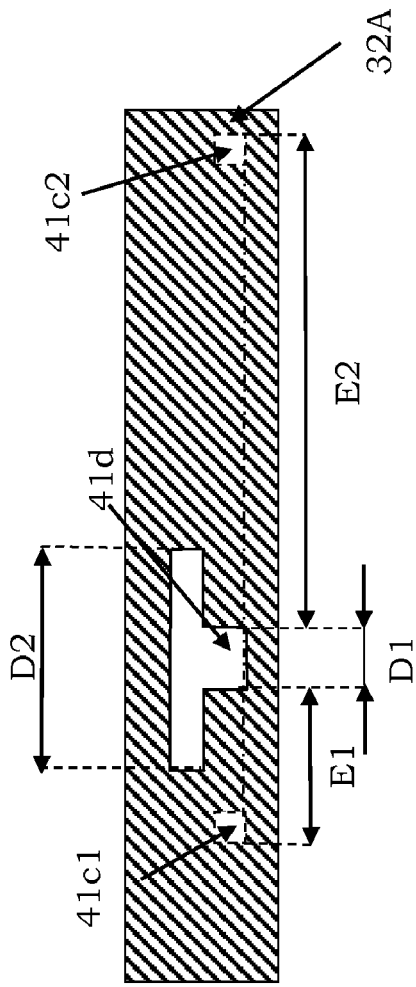
FIG. 5C
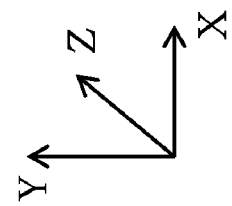

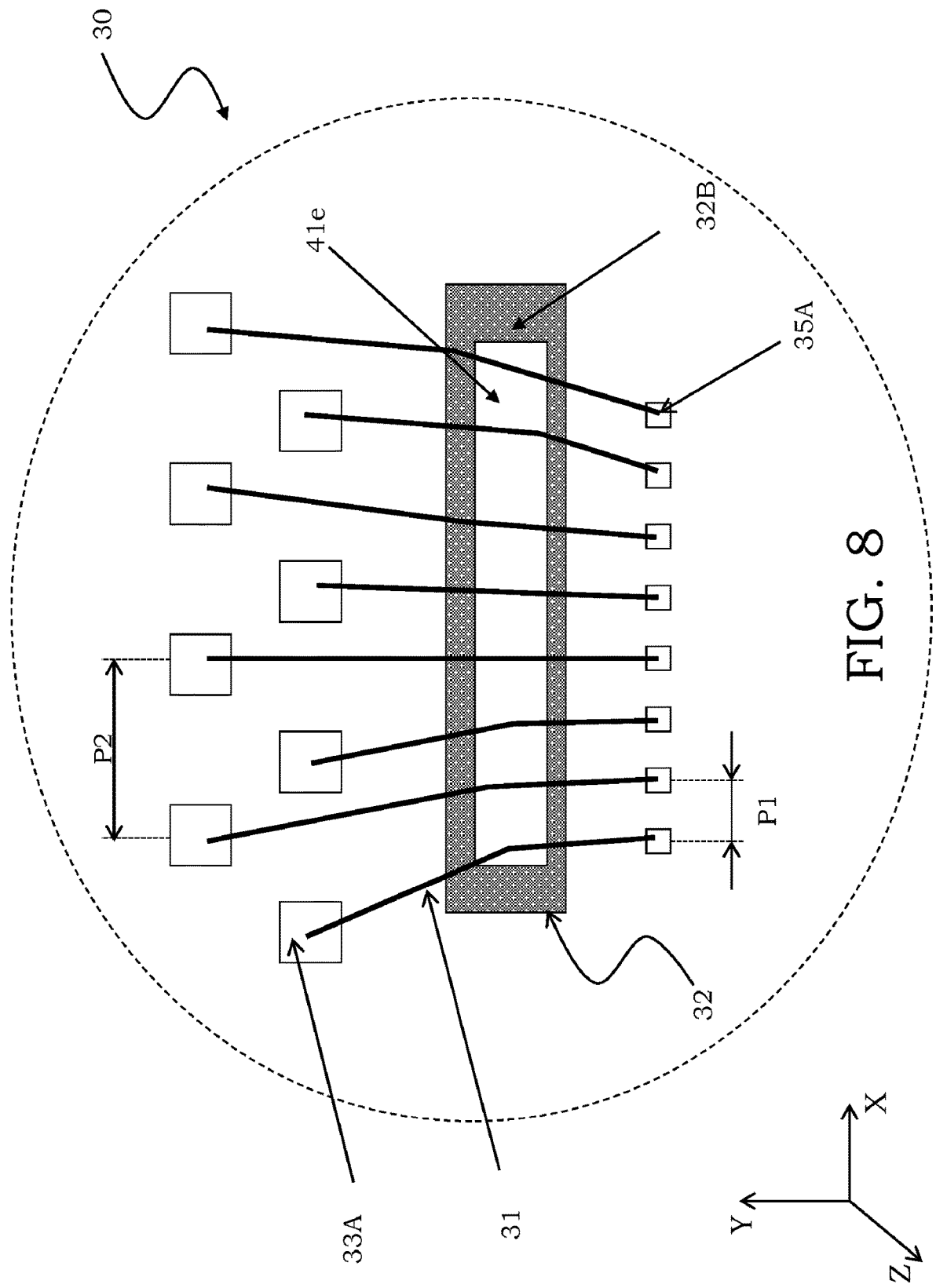

CANTILEVER CONTACT PROBE AND CORRESPONDING PROBE HEAD

BACKGROUND

Technical Field

The present disclosure relates to a cantilever contact probe and to a corresponding probe head.

The disclosure relates particularly, but not exclusively, to a probe head adapted to be installed in a testing apparatus for the electric testing of devices integrated on a semiconductor wafer and the following description is done with reference to this field of application with the only purpose of simplifying the exposition thereof.

Description of the Related Art

As it is well known, a probe head is a device adapted to electrically connect a plurality of contact pads of a microstructure with corresponding channels of an apparatus which performs the test thereof.

The test performed on integrated circuits serves to detect and isolate defective circuits as early as in the production phase. Normally, probe heads are therefore used for the electric test of the circuits integrated on wafers before cutting and assembling them inside a chip containment package.

The so-called "cantilever" probe heads are widely used, i.e., probe heads comprising a plurality of probes protruding in a cantilever manner starting from a suitable support.

In particular, as schematically illustrated in FIG. 1, a probe head with cantilever probes or cantilever probe head 10 normally comprises a support ring 11, for example of aluminum, ceramic or other suitable material, associated with an integrated circuit board or PCB 12. A support 13, normally of resin, is associated with the support ring 11 and is adapted to incorporate a plurality of movable contact elements or contact probes 14, which are generally composed of wires of special alloys with good electric and mechanical properties and exit from the resin support 13 with a suitable angle α with respect to a reference plane, in particular the plane of a device under test 15, for example a wafer of integrated circuits to be tested by those contact probes 14. For this reason, such contact probes 14 are indicated as cantilevered or cantilever probes indeed.

In particular, the cantilever contact probes 14 have an end portion, usually called hook 14a, which is bent with a suitable angulation with respect to a probe body 14b. The hook 14a ends with a contact tip 16A adapted to abut onto a contact pad 15A of the device under test 15. The hooks 14a are therefore bent at a bending point 14c defined between the probe body 14b and the hook 14a, so that the hooks 14a are substantially orthogonal to the plane of the device under test 15.

By using the local reference of FIG. 1, the device under test 15 is therefore arranged horizontally while the hook 14a is arranged vertically, the probe body 14b turning out to be inclined with respect to a plane of the device under test 15 at the angle α.

The good connection between the contact tips 16A of the contact probes 14 of the cantilever probe head 10 and the contact pads 15A of the device under test 15 is ensured by pressing the cantilever probe head 10 on the device itself, the contact probes 14 undergoing a vertical bending in an opposite direction with respect to the movement of the device towards the cantilever probe head 10.

In particular, when the device under test 15 moves vertically against the hook 14a, as it occurs in the normal testing operations of wafers of integrated circuits, the corresponding contact probe 14 bends in a direction being substantially orthogonal to the plane of that device under test 15 and the bending point 14c thereof travels along an arc of a circle.

A first probe section 18a protruding with respect to the resin support 13 in the direction of the device under test 15 thus defines a working arm for the contact probe 14 in the vertical bending movement thereof and it is commonly indicated with the term "free length".

The hook-like shape of the cantilever contact probes 14 is such that, during the contact with the contact pads 15A of the device under test 15 and the upward travel or "overtravel" thereof beyond a prefixed contact point, the hooks 14a move on the contact pads 15A in a direction determined by the geometry of the probe head-device under test system, ensuring the so-called scrub of the contact tips 16A of the cantilever contact probes 14 on those contact pads 15A.

Each cantilever contact probe 14 further comprises a second probe section 18b protruding from the resin support 13 in the direction of the PCB board 12 and ending with a further end 16B of the contact probe 14 which is usually welded to the PCB board 12 at a weld 17.

In order to make that weld, the second probe section 18b should have an appropriate size, in particular in the order of some centimeters; in particular the welds 17 are usually made manually, probe by probe, by using a microscope and tweezers.

It exists therefore the need to provide some space to make the welds 17 and therefore for the probe sections 18b protruding towards the PCB board 12; in particular, the overall dimensions of the cantilever probe head 10 increase by virtue of the space which should be allowed around the support ring 11 to create separate contacts, that is separate welds 17 for each contact probe 14.

In particular it should be kept in mind that, while the sizes of the devices under test 15 in the form of chips or dies are of about 5 mm, the second probe section 18b in order to make the weld 17 should have a length even of centimeters (at least 10 mm=1 cm, that is twice the size of the die).

It should further be noted that the force exerted by each contact probe 14 on the contact pads 15A of the device under test 15 depends on many factors, among which the main ones are: the type of material making the contact probe 14, the shape thereof, the angle α at which it is arranged, the length of the first protruding section 18a or free length thereof and the travel or overtravel of the device under test 15. Those factors further define the extent of the sliding or scrub of the contact hooks 14a on the contact pads 15A.

It is further known in the field to use support rings 11, generally made of aluminum, ceramic or other suitable material, having different sizes, depending on the set of contact pads 15A on which the test should be performed, so as to render the free length value of the contact probes 14 uniform and therefore render the value of the force they exerted on the pads themselves uniform, thus ensuring a constancy of consumption and behavior of the whole cantilever probe head 10.

Alternatively, it is further known to produce a probe head with a vertical technology, as schematically illustrated in FIG. 2.

Such a vertical probe head, globally indicated with 20, comprises a plurality of contact probes 21, normally made of wires of special allows with good electric and mechanical properties and retained by at least one pair of supports or guides which are substantially plate-like and parallel to each other and to a plane defined by a device under test 25, usually in the form of a wafer of integrated circuits, as seen above, the contact probes 21 being in that case extended in a direction being substantially orthogonal to the plane of the device under test 25.

In particular, the vertical probe head 20 comprises at least one lower plate-like support, usually indicated as "lower die" or even simply lower guide 22, and an upper plate-like support, usually indicated as "upper die" or even simply upper guide 23, having respective guiding holes 22A and 23A through which at least one contact probe 21 slides.

The probes and the guides are housed inside a package or case 24 and are placed at a distance from each other so as to leave a free zone or air gap 24A for the movement and possible deformation of the contact probes 21; for this reason such a zone 24A is also indicated as bending zone.

Each contact probe 21 ends at one end with a contact tip 21A intended to abut onto a contact pad 25A of the device under test 25, so as to create the mechanical and electric contact between that device under test 25 and a testing apparatus (not represented) which, in that case too, the vertical probe head 20 forms an end element of.

The term "contact tip" means here and below an end zone or region of a contact probe intended to contact the device under test or the test apparatus, that end zone or region being not necessarily pointed.

In some cases, the contact probes 21 are fixedly constrained to the head itself at the upper guide 23: they are referred to as probe heads with blocked probes.

However probe heads with probes which are not fixedly blocked, but kept interfaced to a so-called board, in case through a micro-contact board provided with respective contact pads, are more frequently used: they are referred to as probe heads with unblocked probes. The micro-contact board is usually called "space transformer" since, besides contacting the probes, it also allows spatially redistributing the contact pads formed on opposite faces thereof and connected through suitable metal tracks inside the space transformer, and therefore releasing the distance constraints between the centers of the pads with respect to what is allowed on the device under test. For convenience of illustration, only the contact pads of the space transformer contacting the contact probes are shown in FIG. 2.

In particular, with reference to such FIG. 2, the contact probe 21 has in this case a further contact tip, indicated as contact head 21B towards a pad 26B of a plurality of contact pads of a space transformer 26. The good electric contact between the probes 21 and the space transformer 26 is always ensured by the pressing abutment of the contact heads 21B of the contact probes 21 onto the contact pads 26B of the space transformer 26, intended to interface to a PCB board, not illustrated.

In the example of FIG. 2, the contact probes 21 further comprise a predeformed portion 21C, adapted to assist a bending of those probes during the pressing contact of the probe head on the device under test 25.

In that case, therefore, the contact heads 21B of the contact probes 21 are not blocked but floating and they come into pressing contact with the contact pads 26B of the space transformer 26.

Furthermore, the space transformer 26 can be produced through different methods, for example according to the so-called direct attach, which provides for the space transformer to be obtained directly from the PCB board which it is intended to be connected to, or according to a wired technology wherein the space transformer is physically separated from the PCB board and connected thereto by means of bonding wires.

The main advantage of the vertical technology is to be able to test devices having near contact pads, that is very narrow pitches and also of the full-array type, that is having pads arranged on all the four sides.

Actually, since in the cantilever technology the tips have a tapered shape, the cantilever probe heads are though successful in terms of pitch, in particular using a multilayer structure for the corresponding support ring and exploiting just the tapered tip pattern to contact very close pads, that is having a reduced pitch.

In the vertical technology, the distance between the pads is limited by the probe diameter and by the ability to bring the guiding holes formed in the guides closer. Here and below, the definition "distance between pads" or pitch indicates the distance between the centers of symmetry of those pads.

With the current technologies, the probe heads produced with the vertical technology do not succeed in achieving the pitches which are obtained with the cantilever probe heads.

The probe heads produced with the vertical technology have instead with respect to cantilever heads, the advantage of succeeding in contacting dies with high parallelisms, with contact tips which "copy" the distribution of the pads on the devices under test.

With the probe heads produced with the cantilever technology there is instead the need to allow some space to make the welds and it is impossible to perform the simultaneous test of several dies in parallel, even if tricks to remedy to this drawback and obtain higher parallelisms than the single die are known, for example to test two close dies, by using steps to offset the probes, or by using diagonally-arranged probes, yet without achieving the vertical technology performances.

Moreover, it should be kept in mind that the problems of positioning the contact probes of the cantilever probe heads are linked to the use of the resin support, a material which performs the desired retention of the probes themselves but introduces undesirable displacements and forces the designer of the cantilever probe heads to take into account suitable corrections when he establishes the position of the different probes therewithin, which obviously limits the reduction of the distance between those probes, in particular between the contact tips thereof and therefore the pitch between the contact pads of the devices which can be tested by means of that probe head.

A probe card electrically connecting modular sub-probe units with a printed circuit board so as to eliminate the need of a space transformer is known for instance from the US Publication No. US 2013/342232 to Park (M2N INC). Moreover, a vertical blade-type probe comprising a body portion made of a conductive metal plate as well as respective lower and upper cantilever portions integral with the body portion is known from the Japanese Publication No. JP 2002-365308 in the name of JAPAN ELECTRONIC MATERIALS.

Furthermore, US Publication No. US 2011/0043232 to Takase et al. (TOKYO ELECTRON LIMITED) discloses a probe head including a probe supporting plate which supports a plurality of probes having an engaging portion which is engaged by the probe supporting plate and US Publication No. US 2010/0219854 to Kuniyoshi et al. (NIHON MICRONICS KK) discloses a probe comprising a base portion having an attaching end and an arm portion extending from the base portion laterally and supporting a probe tip.

BRIEF SUMMARY

The probe head according to the disclosure is able to perform a precise retention of the cantilever contact probes.

The structure of the cantilever probe is modified by comprising at least one shaped body able to fit in a seat having a suitably corresponding and complementary shape formed in a rigid support without using a retaining resin.

According to an aspect of the disclosure, the cantilever testing probe comprises a probe body inserted between a descending probe section and an ascending probe section, such descending probe section extending along a predetermined longitudinal axis inclined with respect to a reference plane corresponding to a plane of a wafer of devices under test when the contact probe is mounted in a cantilever probe head, the cantilever contact probe further comprising at least one end portion, formed in the descending probe section, bent with respect to the longitudinal axis starting from a bending point and ending with a contact tip of the cantilever contact probe adapted to abut onto a contact pad of a device under test of the wafer, the probe body being suitably shaped and comprises at least one base portion provided with an upper portion extending, starting from the base portion, along a longitudinal extension axis of the shaped body, orthogonally to the reference plane and a top portion, connected to the upper portion and having a greater diameter than a diameter of the upper portion, those upper and top portions being substantially shaped so as to form a T, the upper portion being the stem of the T and the top portion being the crosspiece of the T.

More particularly, the cantilever contact probe according to the disclosure comprises the following additional and optional features, taken individually or if necessary in combination.

According to another aspect of the disclosure, the ascending probe section can be connected to the shaped body at the top portion and the descending probe section can be connected to the shaped body at the base portion.

Furthermore, the base portion of the shaped body can comprise at least one pair of arms extending from opposite parts of the base portion along a transversal extension axis of the shaped body which is orthogonal to the longitudinal extension axis and parallel to the reference plane.

In particular, each of those arms can comprise a respective projection which extends orthogonally therefrom, along the longitudinal extension axis of the shaped body in the direction of the top portion.

According to another aspect of the disclosure, the base portion of the shaped body can have a substantially rectangular-shaped longitudinal section and a maximum transversal dimension along the transversal extension axis which is greater than the diameters of the upper and top portions.

Moreover, the shaped body comprising at least the base portion, the upper portion and the top portion can be made as a single piece.

According to another aspect of the disclosure, the cantilever contact probe can comprise a further bending point defined in the ascending probe section close to the top portion of the shaped body, such an ascending probe section being substantially orthogonal to the reference plane and ending with a further contact end of the cantilever contact probe.

Yet according to another aspect of the disclosure, the shaped body can comprise an opening.

In particular, the opening can be formed close to one of the arms having a greater extension than the other one of the arms.

Suitably, the cantilever contact probe can further comprise at least one damping portion formed at the descending probe section and/or at the ascending probe section.

In particular, the at least one damping portion can be formed along the descending probe section, preferably shaped as a pantograph portion connected to the end portion and to the descending probe section at respective bending points and it can comprise four sides arranged substantially as a parallelepiped and defining an empty space therewithin.

The at least one damping portion can be further formed at the ascending probe section and be shaped as a spring portion connected to the shaped body at the further bending point and it can comprise the further contact end of the cantilever contact probe.

A cantilever probe head according to the disclosure comprises a support structure adapted to house a plurality of cantilever contact probes, protruding in a cantilever manner from the support structure on a device under test, each cantilever contact probe being produced as indicated above and comprising a shaped body intended to insert into suitable housing seats formed in the support structure and adapted to retain in a precise manner the cantilever contact probes in the cantilever probe head.

According to another aspect of the disclosure, the support structure can comprise at least one first portion and a second portion, being both preferably ring-shaped, overlapping one an other and provided with respective housing seats of the shaped body of each of the cantilever contact probes.

Yet according to another aspect of the disclosure, the support structure can further comprise at least one third portion placed at at least one arm of the shaped body of each of the contact probes and provided with an indentation adapted to house the at least one arm.

In particular, the first portion of the support structure can comprise at least one first housing seat for the passage and retention of the upper and top portions of the shaped body of the cantilever contact probes.

Furthermore, the first housing seat can have a cross section equal to the union of the cross sections of the upper and top portions of the shaped body.

More particularly, the first portion of the support structure can further comprise a pair of second housing seats having a cross section corresponding and complementary to a cross section of the projections of the arms of the shaped body, those projections being contained in the second housing seats during the normal working of the cantilever probe head.

Furthermore, the second portion of the support structure can comprise suitable openings, placed at the first housing seat, for the passage of the top portion of the shaped body.

According to another aspect of the disclosure, the cantilever probe head can further comprise at least one support plate connected to the second portion of the support structure and provided with holes suitable for the passage of the ascending probe sections provided with the further contact ends of the cantilever contact probes.

More particularly, the support plate can be made of an insulation material and is made integral with the second portion of the support structure or with the PCB board.

According to another aspect of the disclosure, the second portion of the support structure, provided with the support plate can be mounted in pressing contact with the PCB board, the further contact ends of the contact probes at the ascending probe sections abutting onto contact pads of the PCB board.

Yet according to another aspect of the disclosure, the cantilever probe head can comprise a plurality of modules, each provided with a support structure from which cantilever contact probes protrude, which end with respective contact tips or ends, those modules having sizes which can be compared to those of a single device under test.

According to this aspect of the disclosure, the plurality of modules can be distributed so as to cover an area of the PCB board equal to the area of the wafer of devices under test.

More particularly, each of those modules can comprise at least one contact portion, suitably provided with at least one hole adapted to house at least one fixing element.

Each of those modules can further comprise alignment pins having suitable shapes which are complementary to as many housings.

Moreover, the cantilever probe head can further comprise a support structure associated with the PCB board for housing the modules, provided with the housings for the alignment pins of the modules.

Finally, the cantilever probe head can comprise contact probes having respective ascending probe sections with a different size, so as to modify a distribution of the contact pads of the PCB board.

A method of assembling a plurality of cantilever contact probes in a cantilever probe head produced as indicated above, according to the disclosure, comprises the steps of:

inserting each of the cantilever contact probes into the cantilever probe head by inserting the upper and top portions of the shaped body of each of those cantilever contact probes into a corresponding section having a greater diameter than the first housing seat formed in the first portion of the support structure of the cantilever probe head until they pass through the openings formed in the second portion of the support structure of the cantilever probe head, along a first movement direction, which is orthogonal to the reference plane and by inserting the projections of the arms of the shaped body into corresponding second housing seats formed in the first portion of the support structure of the cantilever probe head, along the first movement direction, and fitting the cantilever contact probes into the cantilever probe head by moving the shaped body of each of the cantilever contact probes transversally along a second movement direction, which is orthogonal to the reference plane, the upper portion going to be housed in a lower-diameter section of the first housing seat, so as to block the cantilever contact probes in the cantilever probe head the upper portion of the probe body of each of the cantilever contact probes having a height which is lower than or equal to a thickness of the second portion of the support structure so as to ensure a mechanical coupling between the shaped body and that support structure of the cantilever probe head.

According to another aspect of the disclosure, the step of inserting each of the cantilever contact probes into the cantilever probe head can comprise inserting ascending sections thereof into respective first T-shaped housing seats at a crosspiece of that T having sizes equal to a diameter of the top portion of the shaped body of each of those cantilever contact probes and subsequent lateral displacement for fitting the upper portion of that shaped body at a stem of that T having sizes equal to a diameter of the upper portion.

The features and the advantages of the cantilever contact probe and of the cantilever probe head according to the disclosure will be apparent from the following description of an embodiment thereof given by way of non-limiting example with reference to the attached drawings.

BRIEF DESCRIPTION OF THE SEVERAL VIEWS OF THE DRAWINGS

FIGS. 5A-5C schematically show top plan views of alternative embodiments of a detail of the cantilever probe head realised according to the present disclosure.

FIG. 8 schematically shows a top plan view of the cantilever probe head according to the present disclosure.

DETAILED DESCRIPTION

Figure 1:
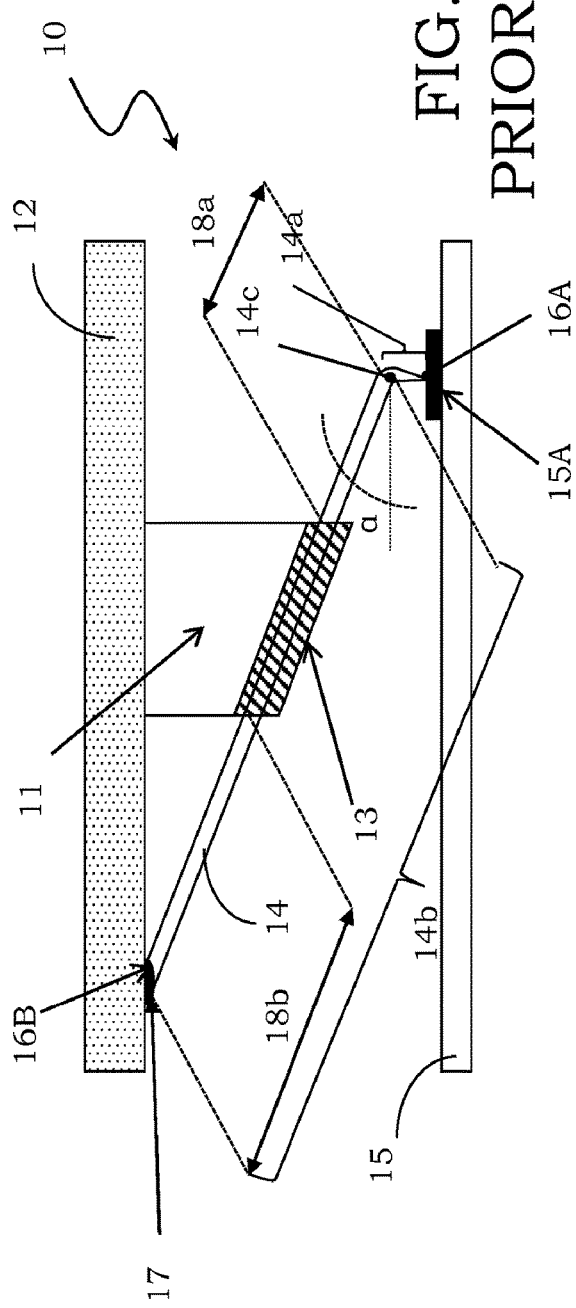
FIG. 1 schematically shows a cross section view of a cantilever probe head realised according to the prior art.
Figure 2:
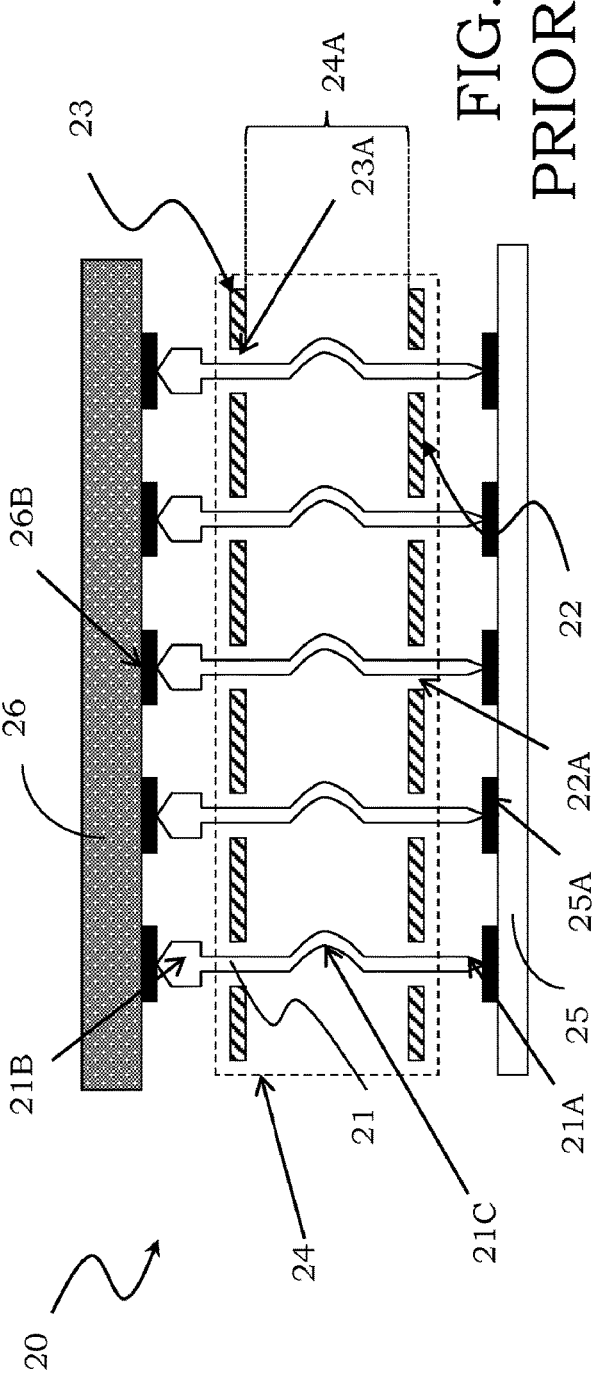
FIG. 2 schematically shows a cross section view of a vertical probe head produced according to the prior art FIG. 3A schematically shows a cross section view of an embodiment of a cantilever contact probe and of a cantilever probe head realised according to the present disclosure.

With reference to these figures, and particularly to FIG. 3A, a probe head in the cantilever technology is described, which is realised according to the present disclosure, hereinafter called cantilever probe head and globally indicated with 30.

It should be noted that the figures are schematic views of the probe head according to the disclosure and are not drawn to scale, but they are instead drawn so as to emphasize the important features of the disclosure. Furthermore, in the figures, the different elements are schematically depicted, the shape thereof being changeable depending on the desired application. It should further be noted that in the figures identical reference numbers refer to identical elements in terms of shape or function. Finally, the different aspects of the disclosure depicted by way of example in the Figures can be obviously combined with each other and interchanged from one embodiment to another.

More particularly, the cantilever probe head 30 comprises a plurality of movable contact elements or contact probes 31, which protrude in a cantilever manner from a support structure 32 adapted to retain the cantilever contact probes 31 according to a predetermined distance relationship from each other and associated with an integrated circuit board or PCB board 33. In the example of FIG. 3A, only one cantilever contact probe 31 is depicted for convenience of illustration. Each cantilever contact probe 31 is normally made of wires of special allows having good electric and mechanical properties, adapted to ensure a good electric contact towards a testing apparatus (not illustrated) through the PCB board 33 and towards a device under test 35.

Suitably, the support structure 32 of the cantilever contact probes 31 comprises a first portion 32A and a second portion 32B respectively, which are for example ring-shaped, overlapping each other and provided with respective housing seats of a body of the contact probe, which is suitably shaped, as it will be better clarified below. In the embodiment of FIG. 3A, the first and second portions 32A, 32B of the support structure 32 are substantially plate-like.

Figure 3A:
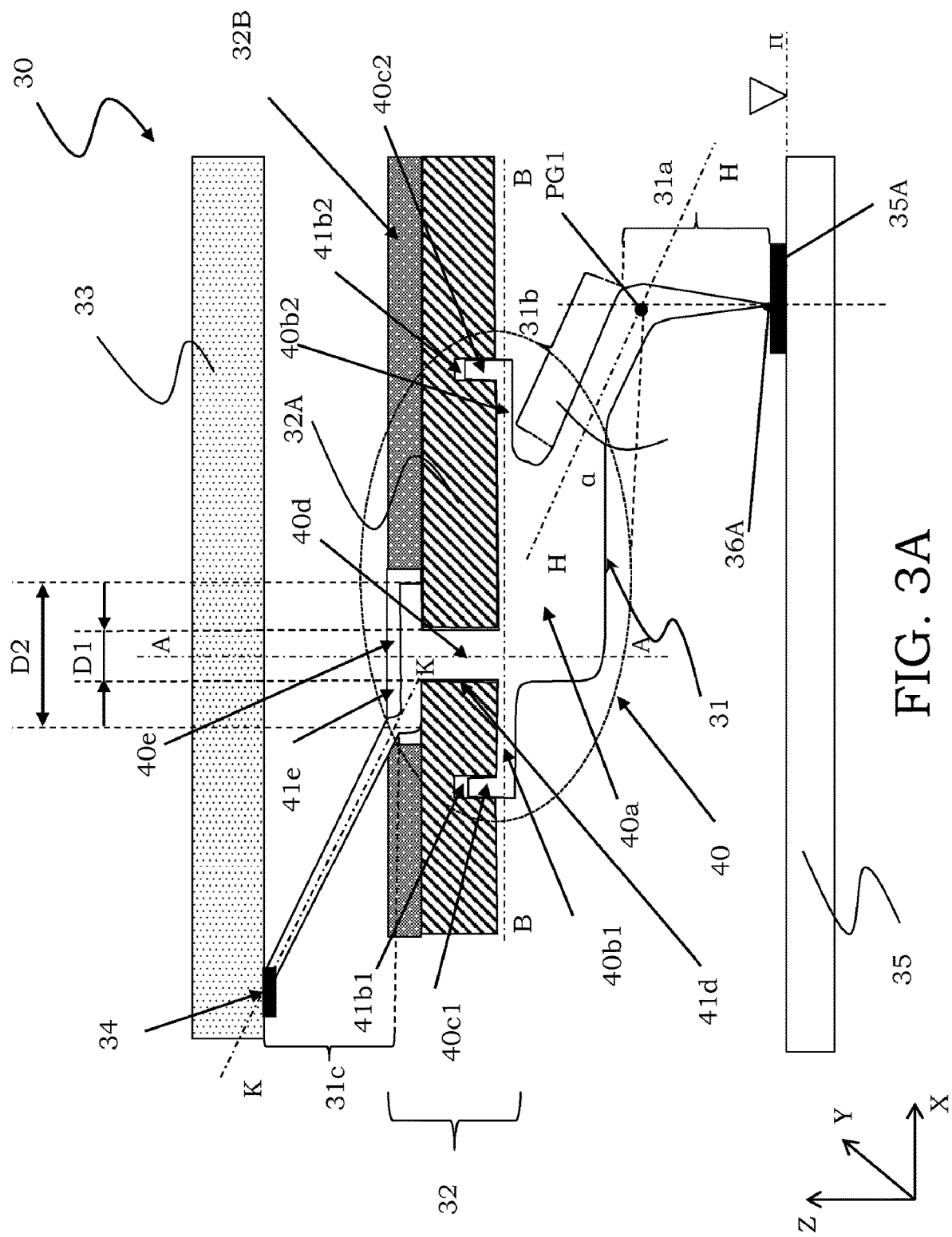
FIGS. 3B and 3C schematically show cross section views of alternative embodiments of a cantilever contact probe realised according to the present disclosure.

More particularly, the first portion 32A is placed so as to face the device under test 35, i.e., downward according to the local reference of FIG. 3A, and the second portion 32B is placed so as to face the PCB board 33, i.e., upward according to the local reference of FIG. 3A.

Those first and second portions 32A and 32B of the support structure 32 can be made of a same or of different materials, selected between those used in the field to make cantilever probe heads, in particular selected between aluminum, ceramic or other suitable material.

As for the known cantilever probe heads, the cantilever contact probes 31 exit from the support structure 32 along a longitudinal axis HH inclined with an angle α with respect to a reference plane π, in particular a plane of the device under test 35, for example a wafer of integrated circuits under test, each contact probe 31 protruding above that wafer as a kind of fishing rod, i.e., in a cantilever manner. In particular, the angle α can have a value from 0 to 65 degrees, preferably 8 degrees.

Suitably, the cantilever contact probes 31 have an end portion, usually called hook 31a, which is bent with respect to a descending probe section 31b which extends along the longitudinal axis HH; in particular, the hook 31a is bent so as to be preferably substantially orthogonal to the reference plane π of the device under test 35 and it forms therefore with the descending probe section 31b an angle equal to the angle α increased by a right angle, i.e., with a value between 90 and 155 degrees, preferably 98 degrees.

The hook 31a ends with a contact tip 36A of the cantilever contact probe 31 adapted to abut onto a contact pad 35A of the device under test 35.

As done in relation to the prior art, it is also pointed out in that case that the term "tip" means an end zone or region of a contact probe being not necessarily pointed.

The hook 31a is in particular bent at a bending point PG1 defined in the descending probe section 31b which protrudes in the direction of the device under test 35 when the cantilever contact probe 31 is mounted in the cantilever probe head 30; that descending probe section 31b defines therefore a working arm for the cantilever contact probe 31 in its vertical bending movement during the contact of the cantilever probe head 30 onto the device under test 35 (i.e., of the contact tips 36A of the cantilever contact probes 31 onto the contact pads 35A of the device under test 35) in the normal operation thereof and the length thereof is usually indicated with the term "free length".

In fact, as explained in relation to the prior art, the good connection between the contact tips 36A of the cantilever contact probes 31 and the contact pads 35A of the device under test 35 is ensured by pressing the cantilever probe head 30 on the device under test 35, the cantilever contact probes 31 undergoing during that contact a bending in a direction which is orthogonal to the reference plane π (i.e., in a direction Z as indicated in FIG. 3A), in an opposite direction with respect to the movement of the device itself.

In particular, when the device under test 35 moves against the hook 31a, the corresponding cantilever contact probe 31 bends and the bending point PG1 thereof travels along an arc of a circle, while the contact tip 36A with which the hook 31a ends moves along the reference plane π, in particular on a respective contact pad 35A, ensuring the so-called scrub of the surface of such a pad.

Furthermore, the hook 31a has a tapered shape, which can be used, in particular in a multilayer structure, to contact contact pads 35A of the device under test 35 which are very close to each other, i.e., with a reduced pitch.

As it is well known to a person skilled in the art, with "pitch" or distance between contact pads is meant the distance between the corresponding centers, meant as centers of symmetry of the pads being concerned.

Each cantilever contact probe 31 further comprises an ascending probe section 31c protruding from the support structure 32 in the direction of the PCB board 33 when the cantilever contact probe 31 is mounted in the cantilever probe head 30. Also the ascending probe section 31c protrudes from the support structure 32 along a longitudinal axis KK which is substantially coincident or parallel to the axis HH of the descending probe section 31b.

That descending probe section 31b continues up to contacting the PCB board 33 which it is suitably connected to, in the example of FIG. 3A by a weld 34.

Suitably, the cantilever contact probe 31 according to the present disclosure further comprises a body 40, which connects the descending probe section 31b and the ascending probe section 31c and is suitably shaped so as to form a fitting with the support structure 32 and thus obtain the desired and precise positioning of the cantilever contact probes 31 inside the cantilever probe head 30 without using the traditional resin support, as it will be clarified below.

More particularly, the shaped body 40 comprises at least one base portion 40a provided with at least one pair of arms 40b1, 40b2 extending from opposite parts of that base portion 40a along a transversal extension axis BB of the shaped body 40, in particular parallel to the reference plane 7C defined by a device under test 35, i.e., in the direction X according to the reference of FIG. 3A; the arms 40b1, 40b2 are further provided with respective projections 40c1, 40c2 which orthogonally extend starting from those arms 40b1, 40b2 along a longitudinal extension axis AA of the shaped body 40, which is in particular orthogonal to the reference plane 7C, i.e., in the direction Z according to the reference of FIG. 3A.

The pair of arms 40b1, 40b2 is intended to be abutting onto a face of the first portion 32A of the support structure 32, in particular a face facing the device under test 35, when the cantilever contact probe 31 is placed in the cantilever probe head 30 and retained by the support structure 32 and the projections 40c1, 40c2 are intended to be housed in suitable housing seats arranged in that first portion 32A, as shown in FIG. 3A and as it will be better clarified below.

Suitably, the shaped body 40 further comprises an upper portion 40d, extending, starting from the base portion 40a, along a longitudinal extension axis AA of the shaped body 40, orthogonally to the reference plane 7C towards the PCB board 33, i.e., in the direction Z according to the reference of FIG. 3A and a top portion 40e, connected to the upper portion 40d and having a greater diameter D2 than a diameter D1 of the upper portion 40d. The upper portion 40d and the top portion 40e are substantially shaped so as to form a T, the upper portion 40d being the stem and the top portion 40e being the crosspiece of that T.

The base portion 40a of the shaped body 40 has a substantially rectangular-shaped longitudinal section and a maximum transversal dimension along the transversal extension axis BB thereof which is greater than the diameters D1, D2 of the upper and top portions, 40d and 40e.

In a preferred embodiment, the different portions of the shaped body 40, in particular the base portion 40a, the arms 40*b*1, 40*b*2 with the projections 40*c*1, 40*c*2, the upper portion 40*d* and the top portion 40*e* are made as a single piece.

Suitably, the ascending probe section 31*c* is connected to the shaped body 40 at the top portion 40*e* thereof and the descending probe section 31*b* is connected to the shaped body 40 at the base portion 40*a* thereof.

The cantilever probe head 30 comprises therefore suitable housing seats for that shaped body 40, globally indicated with 41, formed in the support structure 32.

More particularly, the support structure 32 comprises at least one first housing seat 41*d* formed in the first portion 32A thereof and having a section equal to the union of the sections of the upper portion 40*d* and of the top portion 40*e* of the shaped body 40 of the cantilever contact probe 31, as it will be explained in greater detail below, as well as a pair of second housing seats 41*c*1, 41*c*2 always formed in the first portion 32A thereof, in particular at the face thereof facing the device under test 35, and having a shape corresponding and complementary to the projections 40*c*1, 40*c*2 of the arms 40*b*1, 40*b*2 of the shaped body 40 of the cantilever contact probe 31.

Similarly, the second portion 32B of the support structure 32 comprises suitable openings 41*e*, placed at the first housing seat 41*a*, for the passage of the shaped body 40, in particular of the top portion 40*e* thereof.

Thereby, the shaped body 40 allows a correct retention of the cantilever contact probes 31 inside the cantilever probe head 30 to be performed, in particular of the support structure 32 thereof, the projections 40*c*1, 40*c*2 of the arms 40*b*1, 40*b*2 inserted into the second housing seats 41*c*1, 41*c*2 preventing the cantilever contact probe 31 from moving in a direction which is parallel to the reference plane π, i.e., in the direction X according to the reference of FIG. 3A and the top portion 40*e* abutting onto the second portion 32B thanks to the diameter D2 thereof which is greater than the diameter D1 of the underlying upper portion 40*d* preventing the cantilever contact probe 31 from moving in a direction which is orthogonal to the reference plane π, i.e., in the direction Z according to the reference of FIG. 3A.

Figure 3B:
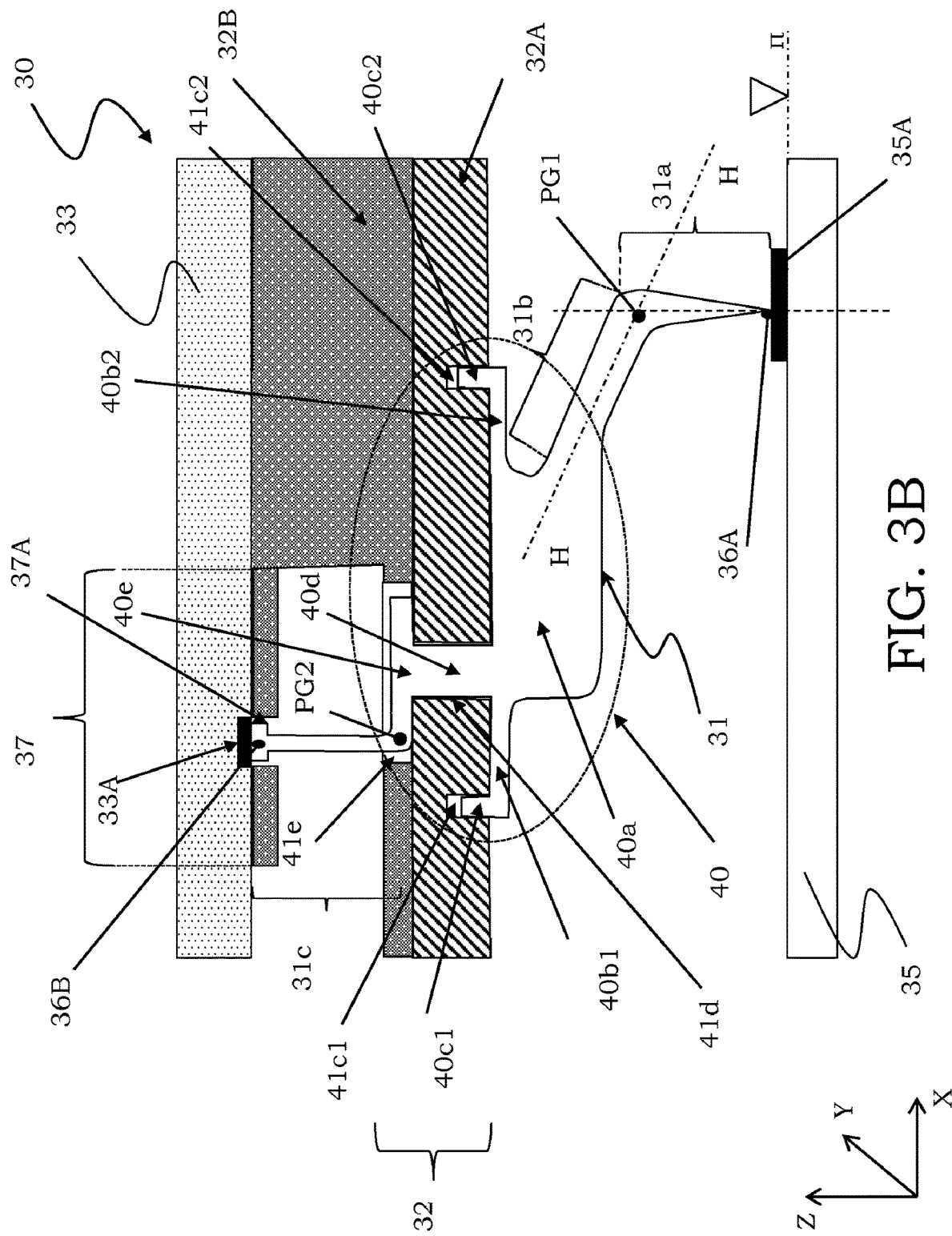

According to an alternative embodiment, schematically illustrated in FIG. 3B, the cantilever contact probe 31 also comprises a further bending point PG2 defined in the ascending probe section 31*c*, preferably at the beginning thereof, i.e., close to the top portion 40*e*, so that the ascending probe section 31*c* is substantially orthogonal to a plane of the PCB board 33, parallel to the reference plane π, so as to form a further end portion of the cantilever contact probe 31 which ends with a further end 36B, which forms a further contact tip of the cantilever contact probe 31 on the PCB board 33.

Thereby, also the ascending probe section 31*c* defines a working arm for the cantilever contact probe 31 when it is pushed against the PCB board 33, in particular during the assembly of the cantilever probe head 30, similarly to the descending probe section 31*b* when in pressing contact on the device under test 35, i.e., during the normal working of the cantilever probe head 30.

It is pointed out that the further end 36B of the contact probes 31 is in that case capable of working like a contact head of a vertical contact probe, as described with reference to the prior art. Suitably, according to this alternative embodiment, as it will be described in greater detail below, thanks to the cantilever contact probes 31 provided with the further bending point PG2 and therefore with an ascending probe section 31*c* which is orthogonal to the PCB board 33, it is possible to adopt the strategies of contact between probes and PCB board which are typical of the vertical technology.

More particularly, suitably according to the present disclosure, the cantilever probe head 30 can further comprise in that case a support plate 37, provided with holes 37A suitable for the passage of the ascending probe sections 31*c* at the further ends 36B of the cantilever contact probes 31.

The support plate 37 can be made of a suitable insulation material, such as ceramic or other suitable material, and connected or made integral, for example by welding, with the second portion 32B of the support structure 32, that support structure 32 being suitably shaped so as to have at least one portion abutting against the PCB board 33 at that support plate 37, as illustrated in FIG. 3B.

The support plate 37 can be fixed to the PCB board 33.

It is pointed out that, advantageously according to the present disclosure, the further end 36B of the contact probe 31 thus contacts directly the PCB board 33, in particular suitable contact pads 33A realised thereon, the corresponding ascending probe section 31*c* being suitably guided by the holes 37A of the support plate 37.

Thereby, thanks to the structure of the contact probe 31 provided with the further bending point PG2 and the ascending probe section 31*c* abutting onto the PCB board 33, it is possible to remove the weld 34 of the cantilever contact probe 31 to the PCB board 33, the contact with that PCB probe 31 at the ascending probe section 31*c*.

In other words, the cantilever contact probe 31, and more particularly the ascending section 31*c* thereof, slides in the support plate 37 provided with holes 37A, in an equivalent manner to the contact heads of the probes in vertical technology and it is provided with a further end 36B suitable for the contact by means of pressure on the contact pads 33A of the PCB board 33.

It is further pointed out that the cantilever contact probe 31, which has suitably an end portion or hook 31*a* which is tapered and bent on a respective contact pad 35A of the device under test 35 starting from the descending probe section 31*b*, is supported by the support structure 32 and retained by fitting therewith at the shaped body 40 thereof so as to preserve a cantilever base structure, for both the probe and the head as a whole.

The cantilever probe head 30 is in that case connected to the PCB board 33 with a methodology similar to the so-called "direct attach" of the vertical technology.

Furthermore, in their working the hook 31*a* and the ascending probe section 31*c* can be compared to two springs placed at opposite ends of the cantilever contact probe 31, i.e., at ends adapted to abut onto respective contact pads during the normal working of the cantilever probe head 30, when abutting onto a device under test 25 and contacting the PCB board 33.

Figure 3C:
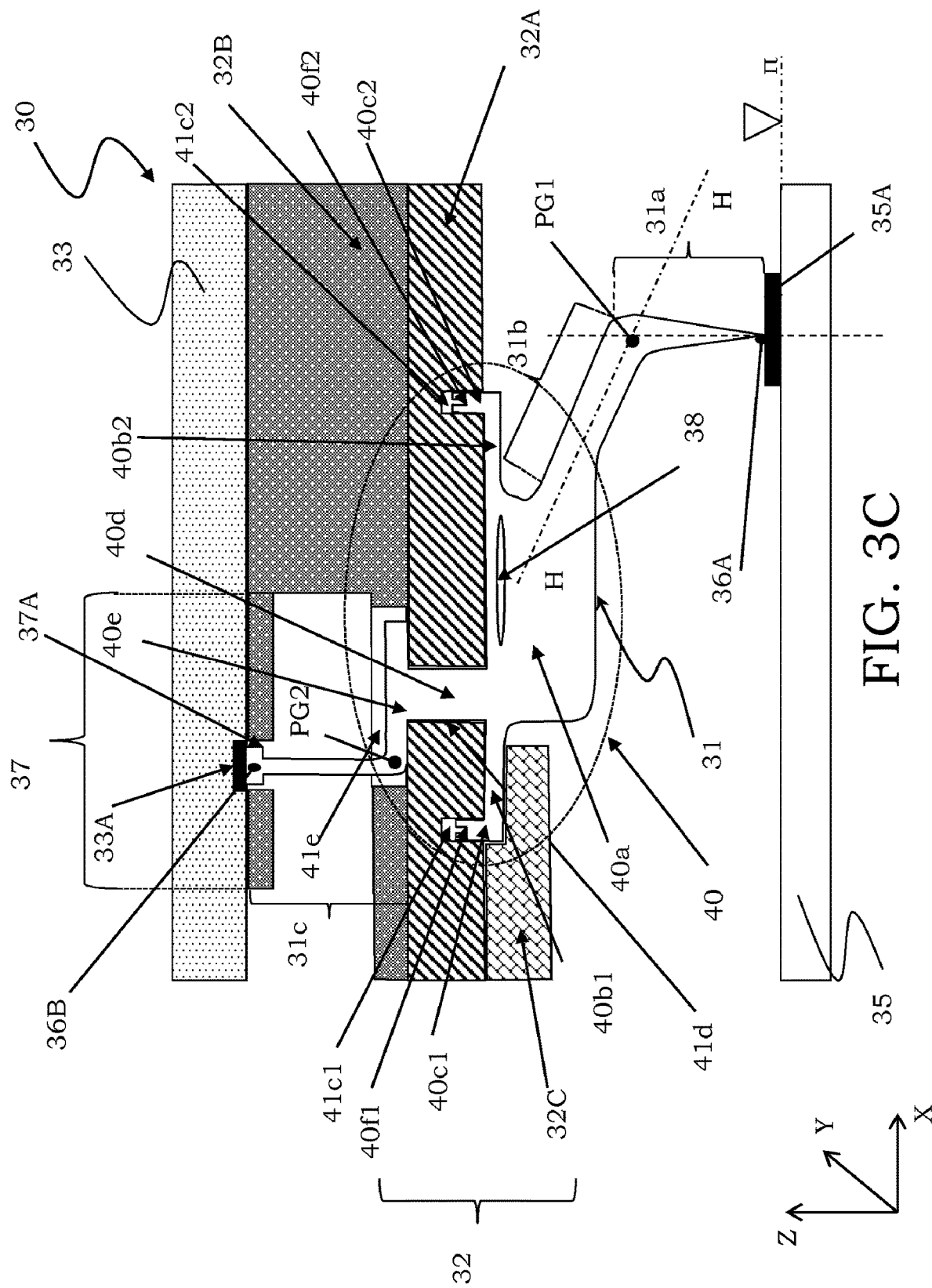

According to a further alternative embodiment schematically illustrated in FIG. 3C, the cantilever contact probe 31 further comprises, at the shaped body 40 thereof, at least one opening 38, which is substantially slot-like and arranged along an axis which is parallel to the transversal extension axis BB of the shaped body 40, capable of increasing the elasticity of the shaped body 40 itself, in particular during the working of the cantilever probe head 30, i.e., during the movement of the hooks 31*a* and of the corresponding descending probe sections 31*b* of the cantilever contact probe 31 contained therein during the pressing contact onto the device under test 35. Preferably, the opening 38 is placed in a portion of the shaped body 40 close to the first portion 32A onto which the shaped body 40 abuts, in particular the base portion 40a thereof, i.e., close to the interface between the shaped body 40 and the first portion 32A of the support structure 32. Preferably, that opening 38 is arranged close to an arm 40b2 having a greater extension.

Furthermore, the cantilever probe head 30 can comprise at least one third portion 32C of the support structure 32 placed at at least one arm, for example the arm 40b1 in the example of FIG. 3C, and suitably provided with an indentation adapted to house that arm 40b1. In particular, the arm 40b1 is thus trapped between the second portion 32B and the third portion 32C of the support structure 32, which prevent the movement thereof.

It is further possible to form that third portion 32C at the other arm 40b2 or at both arms 40b1 and 40b2.

Suitably, the third portion 32C of the support structure 32 serves to retain the contact probes 31, in particular the arms 40b1, 40b2 thereof and it prevents any possible fall of material in case of breaking thereof, thereby ensuring the security of the tested wafer, which does not risk being hit by some material which could damage it.

Finally, it is possible to provide the projections 40c1, 40c2 of the arms 40b1, 40b2 with suitable notches 40/1, 40/2 formed at the portions of those projections 40c1, 40c2 housed in the corresponding housing seats 41c1, 41c2 and capable of increasing the elasticity of those projections 40c1, 40c2.

Figure 4A:
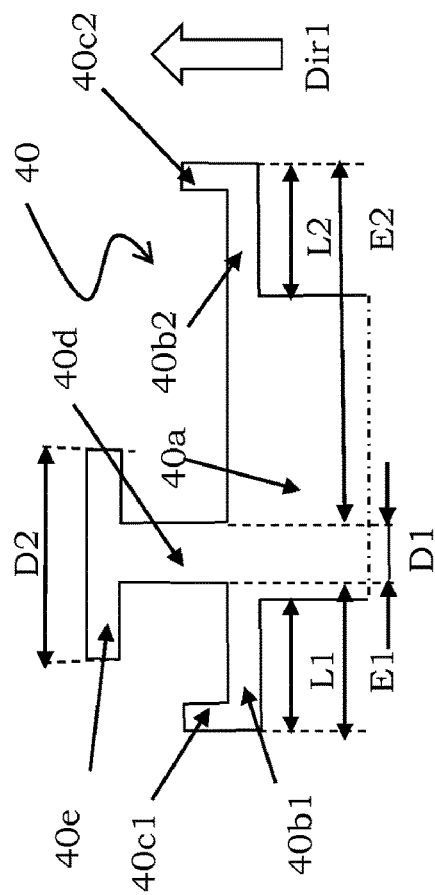
FIGS. 4A-4C schematically show sectional views of alternative embodiments of a detail of a cantilever contact probe realised according to the present disclosure.
Figure 4B:
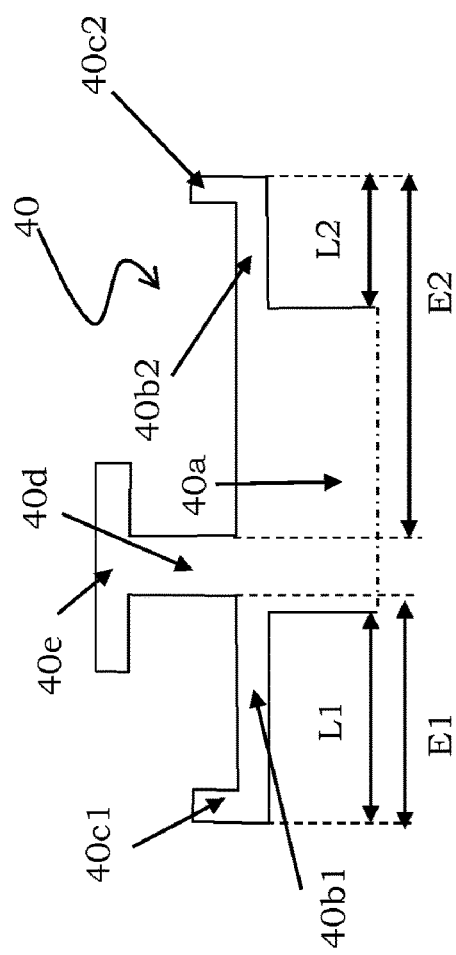
Figure 4C:
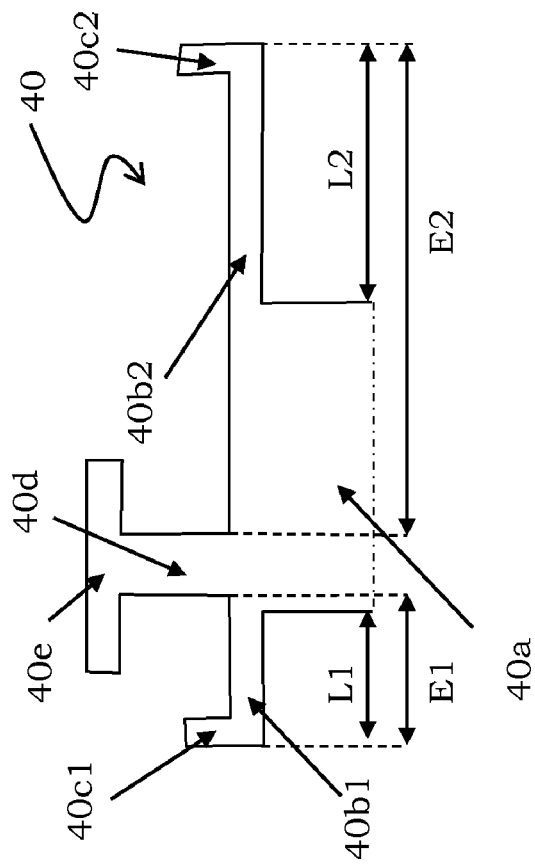

Different embodiments of the shaped body 40 are schematically illustrated in FIGS. 4A-4C.

In particular, in the example of FIG. 4A, the shaped body 40 has arms 40b1, 40b2 having respective lengths L1, L2 which are equal to each other, while in the examples of FIGS. 4B and 4C, the arms 40b1, 40b2 have lengths L1, L2 which are different from each other, those lengths being measured starting from the base portion 40a.

Figure 5A:
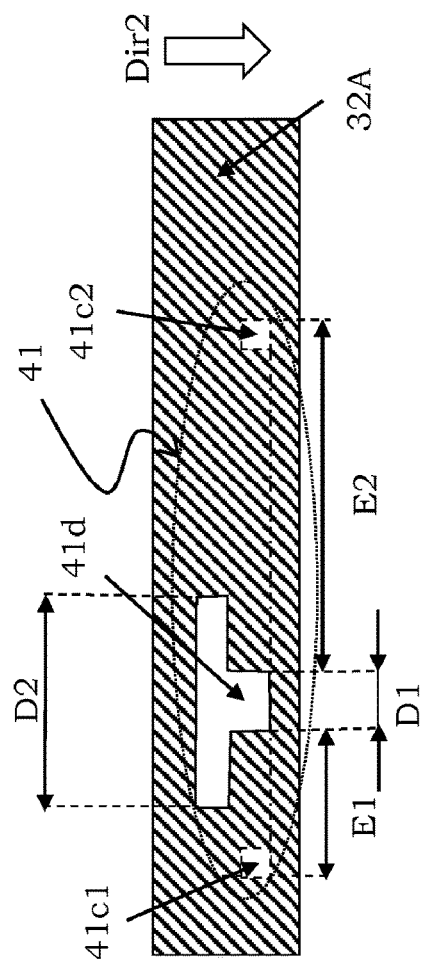
Figure 5B:
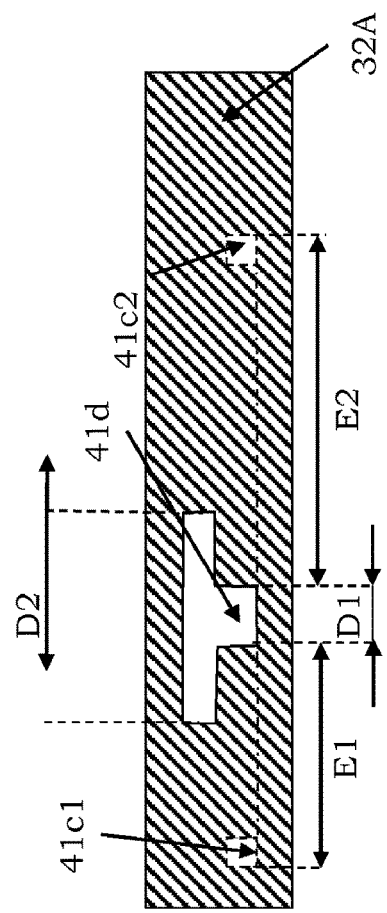

The housing seats 41 of the projections 40c1, 40c2 of the arms 40b1, 40b2 corresponding to the embodiments of the shaped body 40 of FIGS. 4A-4C are schematically illustrated in FIGS. 5A-5C, the second housing seats 41c1, 41c2 being placed at respective distances E1, E2 with respect to the first housing seat 41d corresponding to the different lengths of the projections 40c1, 40c2 of the shaped body 40, those distances being measured starting from the top portion 40e.

The first housing seat 41d has a suitable T-shape, with a stem having the shape and sizes corresponding and complementary to the shape and sizes of the cross section of the upper portion 40d of the shaped body 40 and a crosspiece having the shape and sizes corresponding and complementary to the shape and sizes of the cross section of the top portion 40e, the first housing seat 41d having therefore a shape given by the union of the cross sections of the upper portion 40d and of the top portion 40e.

It should be pointed out that it is thus possible to obtain in a simple and immediate manner the precise positioning and the correct retention of the cantilever contact probes 31 in the support structure 32 of the cantilever probe head 30 comprising them. In particular, the upper portions 40d and top portions 40e of the shaped bodies 40 of the cantilever contact probes 31 are inserted into the support structure 32, in particular into the first portion 32A thereof at the crosspiece of the first housing seat 41d along a first movement direction Dir1, which is orthogonal to the reference plane π as indicated in FIG. 4A, up to the openings 41e, placed at the first housing seat 41d, the projections 40c1, 40c2 of the arms 40b1, 40b2 entering and blocking in the corresponding second housing seats 41c1, 41c2 and therefore transversally moved along a second movement direction Dir2, which is orthogonal to the reference plane π as indicated in FIG. 5A, so as to house the upper portion 40d in the stem of the first housing seat 41d and block the movement of the cantilever contact probes 31.

Suitably, the height of the upper portion 40d of the shaped body 40 is lower than or equal to the thickness of the second portion 32B so as to have a mechanical coupling between the shaped body 40 of the cantilever contact probe 31 and the ceramic support structure 32 of the cantilever probe head 30.

Thereby the cantilever contact probes 31 can be mounted in that cantilever probe head 30 by inserting the ascending sections thereof 31c into respective first T-shaped housing seats 41d at the crosspiece of that T having sizes equal to the diameter D2 of the top portion 40e then to move them laterally by fitting the respective shaped bodies 40, in particular the upper portions 40d thereof at the stem of the T having sizes equal to the diameter D1 of the upper portion 40d of the shaped body 40.

Figure 6A:
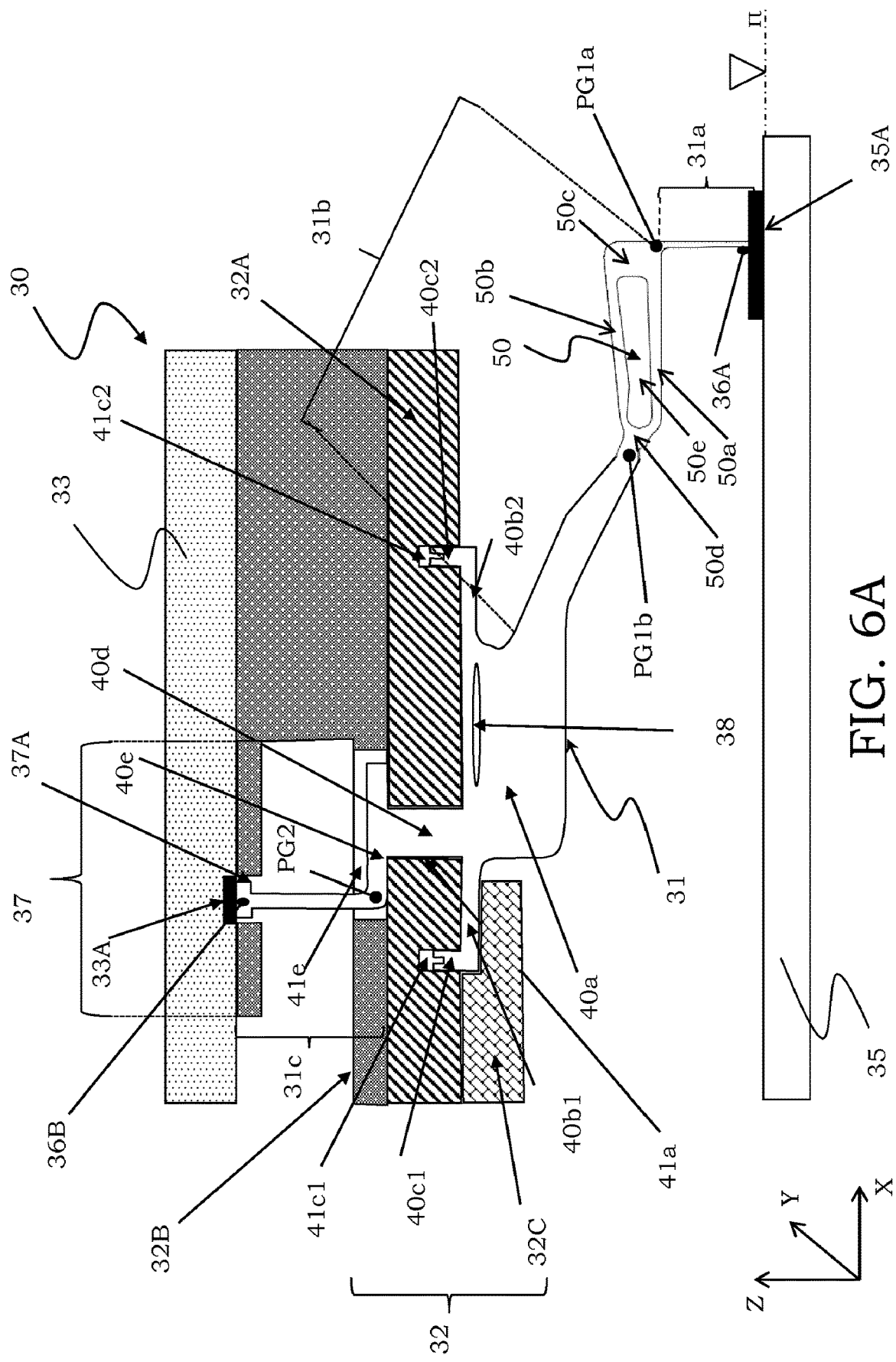
FIGS. 6A and 6B schematically show cross section views of further alternative embodiments of a cantilever contact probe realised according to the present disclosure.

According to a further alternative embodiment schematically illustrated in FIG. 6A, the cantilever contact probe 31 can further comprise a damping portion shaped as a pantograph portion 50, formed at the descending probe section 31b and connected to the hook 31a. By way of example, the cantilever contact probe 31 comprises a shaped body 40 corresponding to the embodiment illustrated in FIG. 3C, but cantilever contact probes 31 provided with a shaped body 40 as that of FIG. 4A or 4C and with the pantograph portion 50 could also be taken into consideration. Always only by way of example, the support structure 32 comprises the third portion 32C for retaining the arms 40b1, 40b2.

More particularly, the pantograph portion 50 is connected to the hook 31a and to the descending probe section 31b at respective bending points PG1a and PG1b.

The pantograph portion 50 comprises four sides 50a-50d having variable sections to uniformly distribute the stresses, arranged substantially as a parallelepiped and defining an empty space 50e therewithin. It is immediately clear that the pantograph portion 50 is capable of performing a desired damping function during the pressing contact of the contact tip 36A of the cantilever contact probe 31 onto the contact pad 35A of the device under test 35.

Figure 6B:
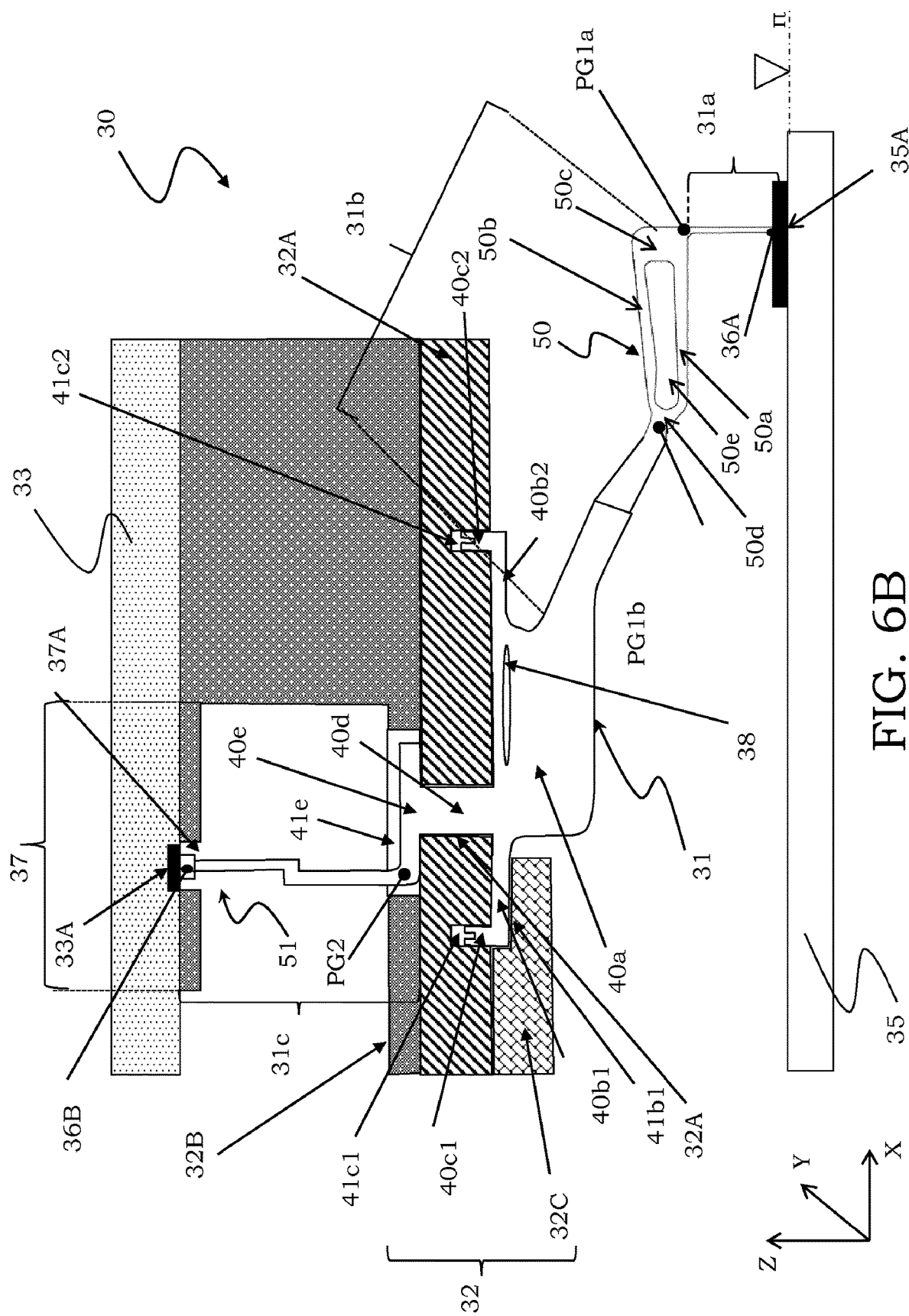

According to a preferred alternative embodiment, schematically illustrated in FIG. 6B, the cantilever contact probe 31 can further comprise a further damping portion shaped as a spring portion 51, formed at the ascending probe section 31c. More particularly, the spring portion 51 is connected to the top portion 40e of the shaped body 40 at the further bending point PG2 and defines the further end 36B suitable for the contact with the contact pads 33A of the PCB board 33. As above, by way of mere example, the cantilever contact probe 31 comprises a shaped body 40 corresponding to the embodiment illustrated in FIG. 3C, but cantilever contact probes 31 provided with a shaped body 40 as that of FIG. 4A or 4C could also be taken into consideration; moreover the support structure 32 is illustrated as comprising the third portion 32C for retaining the arms 40b1, 40b2, which could however also lack.

In the example illustrated in FIG. 6B, the spring portion 51 is substantially shaped as an elongated N. It is immediately clear that the spring portion 51 is capable of performing a desired damping function during the pressing contact of the further end 36A of the cantilever contact probe 31 onto the contact pads 33A of the PCB board 33.

It is obviously possible to realize cantilever contact probes 31 provided with the spring portion 51 and not with the pantograph portion 50.

Figure 7:
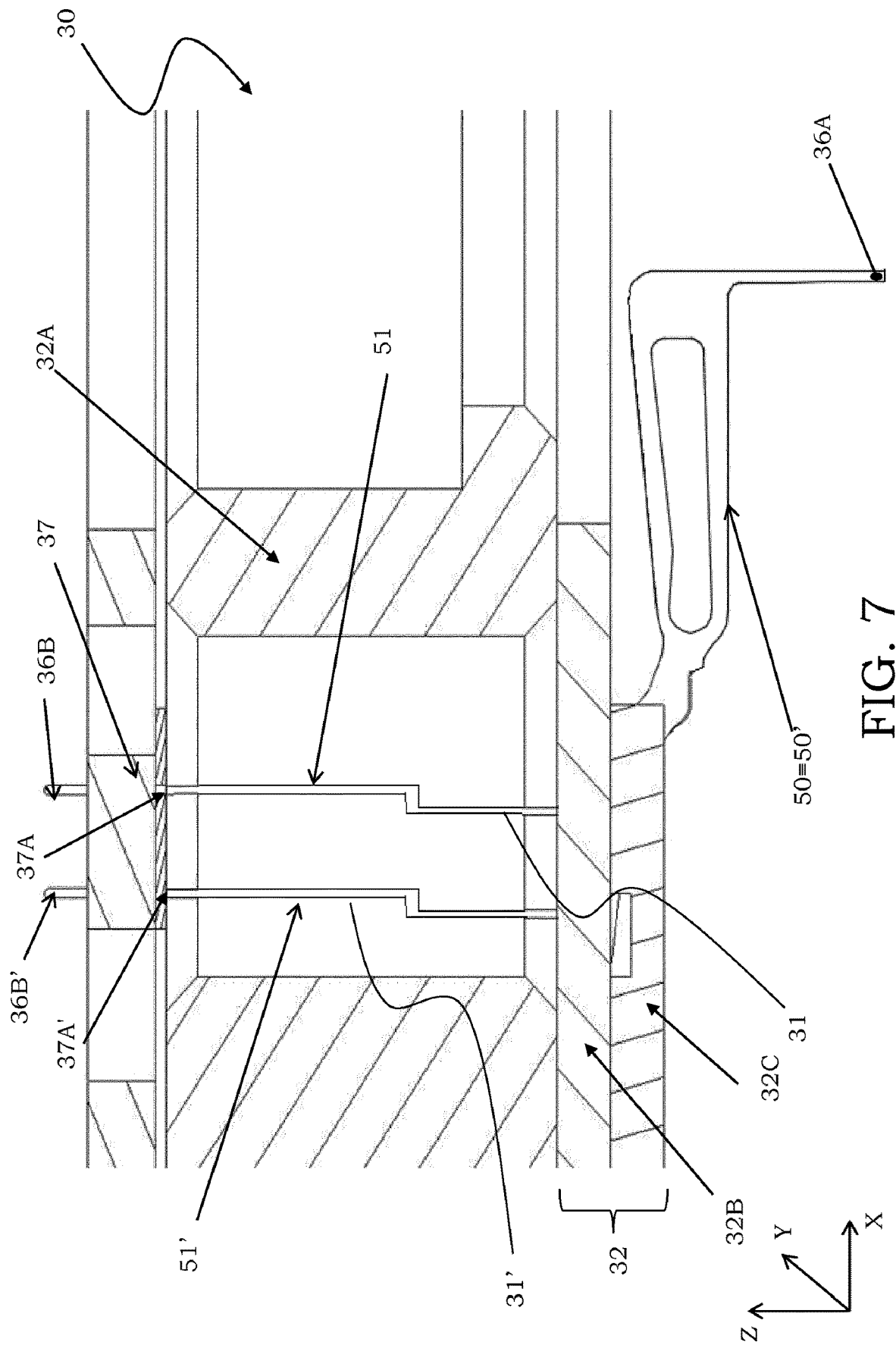
FIG. 7 schematically shows a cross section view of the cantilever probe head of FIG. 6B comprising at least one pair of contact probes.

It should be noted that the presence of the further bending point PG2 defined in the ascending probe section 31c which protrudes in the direction of the PCB board 33 when the contact probe 31 is mounted in the cantilever probe head 30 allows spatially distributing the further ends 36B of the contact probes 31, in particular according to the spatial distribution of the contact pads 33A of the PCB board 33, as schematically illustrated in FIG. 7, by using the embodiment of the cantilever contact probes 31 of FIG. 3C by way of non-limiting example. In particular, the ascending probe sections 31c with the spring portions 51 and therefore the further ends 36B functioning as contact heads of the contact probes 31 are thus distributed over several rows, two in the figure, while the contact tips 36A continue to be aligned in a single row, the pantograph portions 50 being overlapped in the figure.

It is pointed out that, thanks to the different size of the ascending probe sections 31c and of the spring portions 51 formed therein, if any, it is possible to modify the distribution of the contact pads 33A on the PCB board 33, even over more than two rows. It is thus possible to release the pitch constraints for those contact pads 33A of the PCB board 33 with respect to the contact pads 35A of the device under test 35.

It is thereby advantageously possible to create the contact between cantilever contact probes 31 and contact pads 33A of the PCB board 33 without having to insert an additional component, in particular a space transformer, as it traditionally occurs in the vertical technology.

In fact it is well known that the distribution of the contact pads 33A of the PCB board 33 has spatial constraints which are much more released with respect to the distribution of the contact pads 35A of the device under test 35, which the cantilever probe head 30 comprising the above-described cantilever contact probes 31, provided with the further bending point PG2, allows to copy, without using additional components.

In particular, in FIG. 7, a cantilever probe head 30 is illustrated, which comprises at least a first cantilever contact probe 31 and a second cantilever contact probe 31' provided with respective further bending points in the ascending sections thereof connected to respective spring portions 51, 51' adapted to define respective further ends 36B, 36B' which are suitably shifted between each other and therefore capable of contacting pads 33A of the PCB board 33 in different positions. More particularly, the end portions of the ascending probe sections, i.e., of the spring portions 51, 51', are suitably housed in different holes 37A, 37A' of the support plate 37. The cantilever contact probes 31, 31' are further provided with respective pantograph portions 50, overlapping in the view of FIG. 7.

The spatial redistribution of the further ends 36B of the contact probes 31 with respect to the corresponding contact tips 36A is further highlighted by the top plan view of the cantilever probe head 30, with the PCB board 33 showing through, shown in FIG. 8. It is particularly clear in that figure that the configuration of the contact probes 31 provided with the further bending points PG2 allows the contact pads 35A of the device under test 35 having a first distance or pitch P1 to be connected with the contact pads 33A of the PCB board 33 having a second distance or pitch P2, which is greater than the first pitch P1 (P2>P1), performing therefore a desired spatial transformation without having to resort to additional components like a space transformer.

It is further pointed out that the support structure 32 and the support plate 37 are suitably pressed against the PCB board 33 in the assembly phase, so as to ensure a contact of the ascending probe section 31c, and in particular of the further contact portion 36B, of the cantilever contact probes 31 with the contact pads 33A of the PCB board 33 during the normal working of the cantilever probe head 30. That assembly under pressure can be obtained thanks to the presence of the further bending point PG2 which forms the ascending probe section 31c, capable of acting as a spring during the pressing contact of the cantilever contact probes 31 mounted in the cantilever probe head 30, in particular when the support structure 32 provided with the contact plate 37 abuts against the PCB board 33.

That effect is further ensured in the case of cantilever contact probes 31 provided with the spring portion 51, as those illustrated in FIGS. 6B and 7.

It is further pointed out that the cantilever contact probes 31 are suitably sized so as to ensure a sufficient contact force of the contact tips 36A with which the hooks 31a end onto the contact pads 35A of the device under test 35. In particular, the force F exerted by each contact probe 31 is proportional to the arm formed by the probe portion protruding from the support structure 32 and is equal to:

$$F=E*D^4/L^3 \qquad (1)$$

where:

E is the Young's modulus (or longitudinal elastic modulus);

D is the diameter of the contact probe 31, meant as the maximum dimension of the cross section thereof at the descending probe section 31b; and L is the length of the descending probe section 31b, which defines the arm (or free length) thereof.

Suitably according to the present disclosure, a similar force is exerted onto the PCB board 33, in particular onto the contact pads 33A thereof, by the compression of the contact probe 31 at the ascending section 31c thereof, which, as mentioned, substantially acts as a contact head portion of a vertical technology probe.

Advantageously, in the preferred embodiment illustrated in FIGS. 6B and 7, the forces exerted onto the contact pads 35A of the device under test 35 and onto the contact pads 33A of the PCB board 33 are damped by the damping portions, in particular the pantograph portion 50 and the spring portion 51, formed at the descending and ascending probe sections 31b and 31c, respectively, of the cantilever contact probes 31 provided with the further bending point PG2.

As already indicated, the different positioning of the further bending point PG2 further allows a suitable spatial transformation to be obtained and the contact pads 33A of the PCB board 33 to be distributed, in particular by placing them at distances which are appropriate to the greater sizes thereof, as also illustrated in FIG. 8.

It is further pointed out that, thanks to the contact between the ascending probe sections 31c of the cantilever contact probes 31, at the further ends 36A, and the contact pads 33A of the PCB board 33 created during the assembly of the cantilever probe head 30 and in particular thanks to the pressure of the support structure 32 provided with the support plate 37 onto the PCB board 33, the cantilever probe head 30 according to the present disclosure further allows a negative aspect of the vertical technology to be overcome, that is the fact that the contact of the head end portions of the vertical probes with the PCB board is floating and should be recreated each time, at each contact (touch) of the respective tip portions on the contact pads of the device under test.

In other words, in the cantilever probe head 30 according to the present disclosure the contact of the ascending sections 31c of the cantilever contact probes 31 onto the contact pads 33A of the PCB board 33 is ensured even in the absence of a contact of the respective hooks 31a onto the contact pads 35A of the device under test 35.

Moreover, on the basis of the features of the contact probes and of the cantilever probe head according to the present disclosure, it is possible to solve an additional technical problem, in particular with a preferred embodiment of the cantilever probe head 30.

The configuration of the cantilever contact probes 31 provided with the further bending point PG2 and the contact under pressure of the further end 36B onto the PCB board 33 allows in fact a probe head to be produced in a modular manner. More particularly, such a modular probe head comprises a PCB board 33 and a plurality of modules 60, each provided with a support structure 32 from which the contact probes 31 protrude, which end on one side with the hooks 31a and on the other with the ascending sections 31c, the latter being suitably guided by the holes 37A formed in the support plate 37 made integral with the support structure 32, in particular with the second portion 32B thereof. Each module 60 has therefore the features of a cantilever probe head 30 as described above, but it is made with sizes which can be compared, in particular only slightly greater, to those of a single device under test 35, "which can be compared" meaning that the area occupied by a module 60 is equal to the area occupied by a device under test 35 or greater than it for a value which is up to 50% higher, preferably 20% higher.

The plurality of modules 60 are in particular arranged so as to extend over an area corresponding to an area of a chip wafer comprising the devices under test, equivalent to a usable surface of the PCB board, thus producing a modular probe head suitable for the parallel testing of more devices.

More particularly, the PCB board 33 is provided with a suitable support structure or metal housing for housing the modules 60.

Suitably, such a modular probe head, comprising the plurality of modules 60 associated with the PCB board 33, has the advantage of allowing the modules to be individually replaced, in case of damage, which replacement is allowed thanks to the contact performed by the cantilever contact probes 31 at the further end 36B thereof onto the contact pads 33A of the PCB board 33 without requiring welding wires, in a similar manner to the so-called "direct attach" of the vertical technologies.

Figures 9A, 9B:
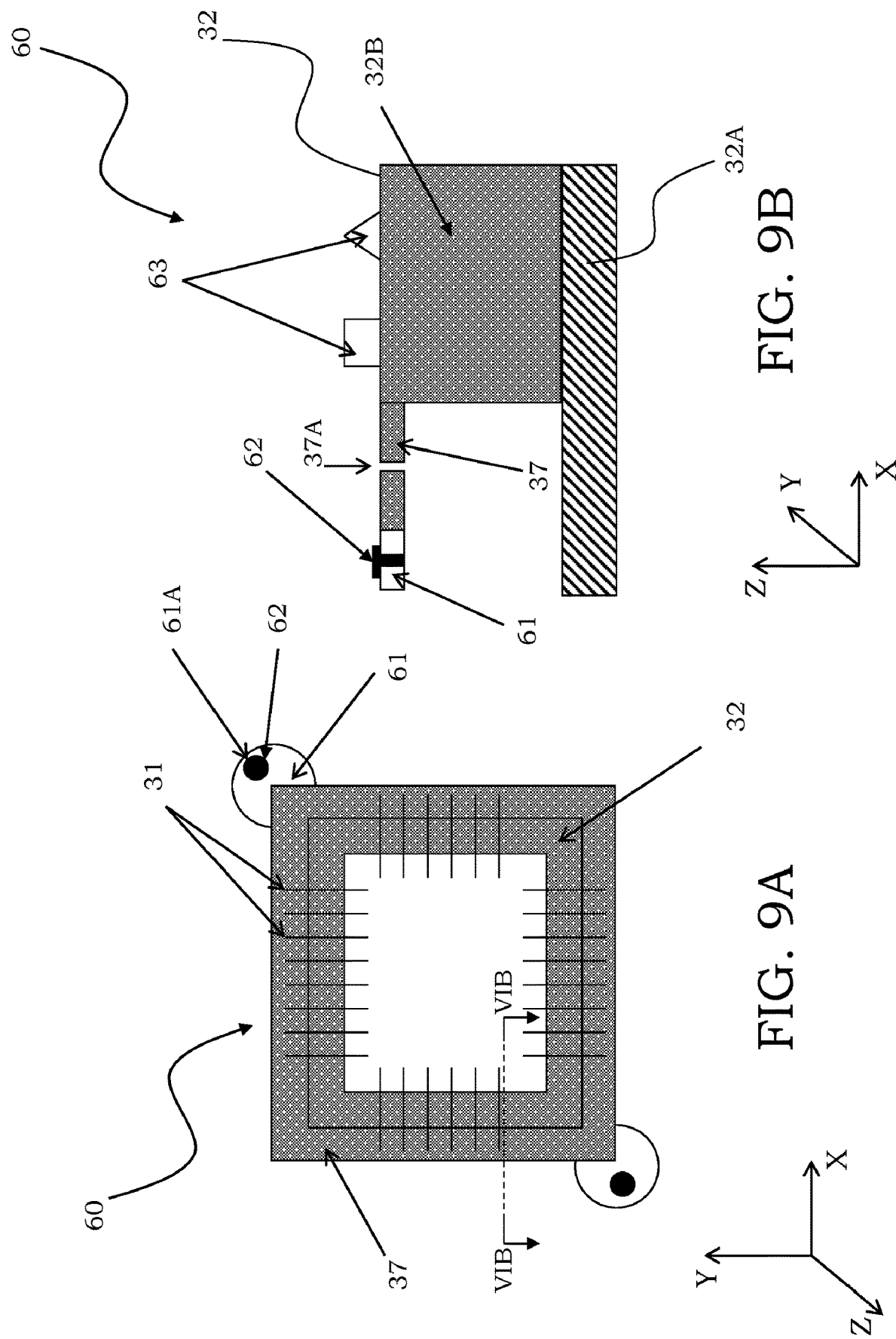
FIGS. 9A and 9B schematically show respective plan and side views of the probe head produced according to the present disclosure in a modular manner.

More particularly, as illustrated in FIGS. 9A and 9B, each module 60 comprises at least one contact portion 61, suitably provided with at least one hole 61A, in particular threaded, adapted to house at least one fixing element, in particular a screw 62, thanks to the screwing thereof the module 60 is made integral with or fixed to the support structure of the PCB board 33 or directly to the PCB board 33 itself.

In a preferred embodiment, illustrated in FIG. 9A, each module 60 is provided with at least one pair of contact portions 61 arranged along the support structure 32 provided with the support plate 37, in particular at opposite angles of that support structure 32 being substantially square.

It is further possible, as schematically illustrated in FIG. 9B, to provide each module with alignment elements or pins 63, having suitable shapes which are complementary to as many housings (not illustrated) prearranged in the support structure of the PCB board 33, so as to ensure a correct positioning of each module 60 with respect to the PCB board 33 and to facilitate the replacement thereof.

More particularly, those alignment pins 63 can be shaped as small cylinders or pyramids protruding from the support structure 32 in the direction of the PCB board 33, adapted to find their place in suitable housings of the support structure of the PCB board 33 with a limited clearance, for example less than 10 microns, so as to ensure a precise assembly of each module 60, thanks to the coupling between housings and alignment pins 63.

The support structure or metal housing for housing the modules 60 is further suitably provided with contact points for the alignment with the PCB board 33.

It is pointed out that a modular probe head comprising the plurality of modules 60 has the further advantage of making it possible to replace only a portion thereof, for example in case of damage, so far an exclusive advantage of the vertical technology which, having the so-called floating contact probes, allows one or more damaged probes to be replaced by simply withdrawing them. Suitably, the replaceable portion, corresponding to one or more modules 60, has lower sizes than the whole probe card, that is lower than the sizes of a wafer of devices under test, therefore reducing the maintenance costs of the probe card itself, which is particularly desired in so-called low-cost or mass-production fields like the memory testing field.

The use of the modules 60 provided with suitable contact portions 61 which allow fixing, for example by screwing, to the support structure of the PCB board 33 makes the operations of replacing a damaged portion even easier than the replacement of one or more probes of the heads produced in vertical technology, that operation of replacing the modules 60 being allowed to occur directly in the test apparatus where the probe head is installed and without using highly skilled workers.

In conclusion, it is pointed out that the cantilever contact probe provided with the shaped body is capable of coupling in a correct and precise manner with corresponding housing seats formed in a support structure of a cantilever probe head wherein that probe is housed.

Thereby, the probe head produced thanks to those cantilever contact probes does not require the use of a retaining resin like in the traditional cantilever technology.

Moreover, in the case of cantilever contact probes provided with at least one further bending point in the ascending sections thereof intended to protrude from the support structure in the direction of the PCB board, as explained above, it is possible to realize a cantilever probe head which combines the advantages of the cantilever technology, maintaining the base structure thereof, to those of the vertical technology, with contacts performed without welds and without the need to have much greater areas with respect to the overall dimensions of the support structure of that probe head, with which only the support plate is made integral.

In particular, it is pointed out that such a probe head is surely not expensive, both at the manufacture time, thanks to the reduced costs which are typical of the cantilever technology, and during the probe head life, in particular thanks to the use of individually-replaceable modules.

Furthermore, thanks to the configuration of the cantilever contact probes provided with ascending sections which are substantially orthogonal to the PCB board, it is possible to easily modify the distance or pitch of the contact pads of the PCB board itself; in fact it is sufficient to "fan out" those ascending probe sections ending with the further contact ends, by simply modifying the length thereof, being thus able to form on the PCB board which are even very large and very distant contact pads.

Accordingly, it is possible to also reduce the cost of the PCB board associated with the cantilever probe head, which is tied to the density or pitch and size of the pads thereof indeed.

It is further pointed out that the probe head itself produced according to the present disclosure becomes a space transformer, which allows the cost of the PCB board to be further reduced, the most relevant cost for test apparatuses and tied, as mentioned, to the density or pitch and sizes of the contact pads indeed.

Furthermore, the presence of damping portions at one or more probe sections allows the contact of the corresponding end portions on the contact pads of the device under test and/or of the PCB board to be improved.

Finally, the realization of the cantilever probe head according to the present disclosure in a modular manner ensures the possibility to replace only the damaged head portions, corresponding to one or more modules.

From the foregoing it will be appreciated that, although specific embodiments of the disclosure have been described herein for purposes of illustration, various modifications may be made without deviating from the spirit and scope of the disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A cantilever contact probe having a contact tip configured to abut onto a contact pad of a device under test of a wafer of devices under test, the cantilever contact probe comprising:
a descending probe section, extending along a longitudinal axis inclined with respect to a reference plane being a plane of the wafer of devices under test when the contact probe is mounted in a cantilever probe head;
an ascending probe section;
a shaped probe body inserted between the descending probe section and the ascending probe section; and
at least one end portion, formed in the descending probe section, bent with respect to the longitudinal axis starting from a bending point and ending with the contact tip of the cantilever contact probe,
the shaped probe body comprising:
a base portion;
an upper portion extending, starting from the base portion, along a longitudinal extension axis of the shaped probe body, orthogonally to the reference plane; and
a top portion, connected to the upper portion and having a greater diameter than a diameter of the upper portion,
the upper and top portions being shaped so as to form a structure having a T-shaped cross section orthogonally to the reference plane, the upper portion being a stem of the structure having the T-shaped cross section and the top portion being a crosspiece of the structure having the T-shaped cross section,
the base portion comprising at least one pair of arms extending, from opposite parts of the base portion along a transversal extension axis orthogonal to the longitudinal extension axis of the shaped probe body and parallel to the reference plane,
wherein each of the arms of the base portion comprises a respective projection which extends orthogonally starting therefrom, along the longitudinal extension axis of the shaped probe body in the direction of the top portion, and
wherein the shaped probe body comprises at least the base portion, the upper portion and the top portion being made as a single piece.

2. The cantilever contact probe of claim 1, wherein the ascending probe section extends from the top portion of the shaped probe body and the descending probe section extends from the base portion of the shaped probe body.

3. The cantilever contact probe of claim 1, wherein the base portion of the shaped probe body has a substantially rectangular-shaped longitudinal section and a maximum transversal dimension along the transversal extension axis which is greater than the diameters of the upper and top portions.

4. The cantilever contact probe of claim 1, comprising a further bending point defined in the ascending probe section close to the top portion of the shaped probe body, the ascending probe section being substantially orthogonal to the reference plane and ending with a further contact end of the cantilever contact probe.

5. The cantilever contact probe of claim 1, wherein the shaped probe body comprises an opening.

6. The cantilever contact probe of claim 5, wherein the opening is formed closer to one of the arms having an extension which is greater than the other one of the arms.

7. The cantilever contact probe of claim 1, further comprising at least one damping portion formed at the descending probe section or at the ascending probe section.

8. The cantilever contact probe of claim 7, wherein the at least one damping portion is formed along the descending probe section, and is shaped as a pantograph portion connected to the end portion and to the descending probe section at respective bending points and comprises four sides having variable sections arranged substantially as a parallelepiped and defining an empty space therewithin.

9. The cantilever contact probe of claim 7, wherein the at least one damping portion is formed at the ascending probe section and is shaped as a spring portion connected to the shaped probe body at the further bending point and comprises the further contact end of the cantilever contact probe.

10. A cantilever probe head, comprising:
a plurality of cantilever contact probes; and
a support structure configured to house the plurality of cantilever contact probes, each of the cantilever contact probes protruding in a cantilever manner from the support structure on a device under test,
wherein each cantilever contact probe comprises a shaped probe body configured to be inserted into corresponding housing seats formed in the support structure and configured to retain the cantilever contact probes in the cantilever probe head, the shaped probe body comprising:
a base portion;
an upper portion extending, starting from the base portion, along a longitudinal extension axis of the shaped probe body, orthogonally to the reference plane; and
a top portion, connected to the upper portion and having a greater diameter than a diameter of the upper portion, the upper and top portions being shaped so as to form a structure having a T-shaped cross section orthogonally to the reference plane, the upper portion being a stem of the structure having the T-shaped cross section and the top portion being a crosspiece of the structure having the T-shaped cross section, the base portion comprising at least one pair of arms extending, from opposite parts of the base portion along a transversal extension axis orthogonal to the longitudinal extension axis of the shaped probe body and parallel to the reference plane, each of the arms of the base portion comprising a respective projection which extends orthogonally starting therefrom, along the longitudinal extension axis of the shaped probe body in the direction of the top portion, and the shaped probe body comprising at least the base portion, the upper portion and the top portion being made as a single piece; and wherein the support structure includes at least one first portion and one second portion, both preferably ring-shaped, overlapping each other, the at least one first portion of the support structure comprising:

at least one first housing seat for the housing of the upper and top portions of the shaped probe body of the cantilever contact probes, the first housing seat having a cross section equal to the union of cross sections of the upper and top portions of the shaped probe body; and a pair of second housing seats having a cross section corresponding and complementary to a cross section of the projections of the arms of the shaped probe body, the projections being housed in the second housing seats during the normal working of the cantilever probe head, wherein the second portion of the support structure comprises openings, placed at the first housing seat, allowing the passage of the top portion of the shaped probe body.

11. The cantilever probe head of claim 10, wherein the support structure further comprises at least one third portion placed at at least one arm of the shaped probe body of each of the cantilever contact probes and provided with an indentation adapted to house the at least one arm.

12. The cantilever probe head of claim 10, further comprising at least one support plate connected to the second portion of the support structure and provided with holes suitable for the passage of the ascending probe sections provided with the further contact ends of the cantilever contact probes.

13. The cantilever probe head of claim 12, wherein the support plate is made of an insulation material and is integral with the second portion of the support structure or with a PCB board.

14. The cantilever probe head of claim 12, wherein the second portion of the support structure, provided with the support plate is mounted in pressing contact with a PCB board, the further contact ends of the cantilever contact probes at the ascending probe sections abutting onto contact pads of the PCB board.

15. The cantilever probe head of claim 10, comprising a plurality of modules, each provided with a support structure from which cantilever contact probes protrude, which end with respective contact tips or ends, the modules having an area having a value being equal to or 50% higher than the value of an area occupied by a device under test of the wafer of device under test.

16. The cantilever probe head of claim 15, wherein the plurality of modules is distributed so as to cover an area of a PCB board equal to that of the wafer of devices under test.

17. The cantilever probe head of claim 15, wherein each of the modules comprises at least one contact portion, suitably provided with at least one hole configured to house at least one fixing element.

18. The cantilever probe head of claim 15, wherein each of the modules further comprises alignment pins having shapes which are complementary to housings of a PCB board and configured to position each of the modules with respect to the PCB board.

19. The cantilever probe head of claim 10, further comprising a support structure associated with a PCB board for housing the modules, provided with the housings for the alignment pins of the modules.

20. The cantilever probe head of claim 10, further comprising contact probes having respective second end portions with a different size, so as to modify a distribution of the contact pads of a PCB board.

21. A method of assembling a plurality of cantilever contact probes in a cantilever probe head, each cantilever contact probe comprising a shaped probe body having:

a base portion;

an upper portion extending, starting from the base portion, along a longitudinal extension axis of the shaped probe body, orthogonally to the reference plane; and a top portion, connected to the upper portion and having a greater diameter than a diameter of the upper portion, the upper and top portions forming a T structure and the base portion comprising at least one pair of arms extending, from opposite parts of the base portion, each of the arms of the base portion comprising a respective projection which extends orthogonally starting therefrom, wherein the cantilever probe head comprises a support structure adapted to house the cantilever contact probes and having:

at least one first portion and one second portion, both ring-shaped, overlapping each other, the first portion of the support structure comprising:

at least one first housing seat for the housing of the upper and top portions of the shaped probe body of the cantilever contact probes, the first housing seat having a cross section equal to the union of cross sections of the upper and top portions of the shaped probe body; and a pair of second housing seats having a cross section corresponding and complementary to a cross section of the projections of the arms of the shaped probe body, the projections being housed in the second housing seats during the normal working of the cantilever probe head; and the second portion of the support structure comprising openings, placed at the first housing seat, allowing the passage of the top portion of the shaped probe body;

the method comprising:

inserting each of the cantilever contact probes into the cantilever probe head by inserting the upper and top portions of the shaped probe body of each of the cantilever contact probes into a corresponding section having a greater diameter than the first housing seat formed in the first portion of the support structure of the cantilever probe head until they pass through the openings formed in the second portion of the support structure of the cantilever probe head, along a first movement direction, which is orthogonal to the reference plane and by inserting the projections of the arms of the shaped probe body into corresponding second housing seats formed in the first portion of the support structure of the cantilever probe head along the first movement direction; and fitting the cantilever contact probes into the cantilever probe head by moving the shaped probe body of each of the cantilever contact probes transversally along a second movement direction, which is orthogonal to the reference plane, the upper portion going to be housed into a lower-diameter section of the first housing seat, so as to block the cantilever contact probes in the cantilever probe head, the upper portion of the shaped probe body of each of the cantilever contact probes having a height which is lower than or equal to a thickness of the second portion of the support structure so as to ensure a mechanical coupling between the shaped probe body and the support structure of the cantilever probe head.

22. The method of assembling of claim 21, wherein inserting each of the cantilever contact probes into the cantilever probe head comprises inserting ascending sections thereof into respective first housing seats having a T-shaped cross section along the reference plane having sizes equal to a diameter of the top portion of the shaped probe body of each of the cantilever contact probes at a crosspiece of the T-shaped cross section of the first housing seats and subsequent lateral displacement for fitting the upper portion of the shaped probe body at a stem of the T-shaped cross section of the first housing seats having sizes equal to a diameter of the upper portion.

* * * * *